United States Patent
Cheng et al.

[11] Patent Number: 6,107,208
[45] Date of Patent: Aug. 22, 2000

[54] NITRIDE ETCH USING $N_2$/AR/$CHF_3$ CHEMISTRY

[75] Inventors: Jerry Cheng, Milpitas; Fei Wang, San Jose, both of Calif.

[73] Assignee: Advanced Micro Devices, Inc., Sunnyvale, Calif.

[21] Appl. No.: 09/090,670

[22] Filed: Jun. 4, 1998

[51] Int. Cl.[7] .................................................. H01L 21/05
[52] U.S. Cl. .......................... 438/724; 438/738; 438/740; 438/741; 438/744
[58] Field of Search .................... 438/724, 738, 438/744, 740, 741; 252/79.1

[56] References Cited

U.S. PATENT DOCUMENTS

| | | | |
|---|---|---|---|
| 4,028,155 | 6/1977 | Jacob | 156/643 |
| 4,521,275 | 6/1985 | Purdes | 156/643 |
| 4,581,101 | 4/1986 | Senoue et al. | 156/643 |
| 4,919,748 | 4/1990 | Bredbenner et al. | 156/643 |
| 5,573,679 | 11/1996 | Mitchell et al. | 216/2 |
| 5,661,052 | 8/1997 | Inoue et al. | 438/303 |
| 5,674,787 | 10/1997 | Zhao et al. | 437/230 |
| 5,700,737 | 12/1997 | Yu et al. | 438/636 |
| 5,705,430 | 1/1998 | Avanzino et al. | 437/195 |

OTHER PUBLICATIONS

Runyan, W.R. and K.E. Bean, Semiconductor Integrated Circuit Processing, Chapter 6.2.12 (1990), pp. 267–268.

*Primary Examiner*—William Krynski
*Assistant Examiner*—Michael E. Grendzynski
*Attorney, Agent, or Firm*—Renner, Otto, Boisselle & Sklar LLP

[57] ABSTRACT

In one embodiment, the present invention relates to a method of etching silicon nitride disposed over a copper containing layer by etching at least a portion of the silicon nitride using a nitride etch gas mixture comprising from about 5 sccm to about 15 sccm of $CHF_3$, about 5 sccm to about 15 sccm of nitrogen and about 80 sccm to about 120 sccm of a carrier gas. In another embodiment, the present invention relates to a method of processing a semiconductor substrate comprising silicon nitride disposed over a copper containing layer, involving etching at least a portion of the silicon nitride using a nitride etch gas mixture comprising $CHF_3$, nitrogen and Ar.

22 Claims, 3 Drawing Sheets

000
NITRIDE ETCH USING N₂/AR/CHF₃ CHEMISTRY

TECHNICAL FIELD

The present invention generally relates to processing a semiconductor substrate. In particular, the present invention relates to methods of etching a silicon nitride layer which is disposed over a copper containing layer.

BACKGROUND ART

Conventional semiconductor devices typically comprise a semiconductor substrate, normally made of monocrystalline silicon, and a plurality of dielectric and conductive layers formed thereon. An integrated circuit is formed containing a plurality of conductive patterns comprising conductive lines separated by interwiring spacings, and a plurality of interconnect lines, such as bus lines, bit lines, word lines and logic interconnect lines. Such interconnection lines, made of metal interconnect materials, generally constitute a limiting factor in terms of various functional characteristics of the integrated circuit. As such, there exists a need to provide a reliable interconnection structure capable of achieving higher operating speeds, improved signal-to-noise ration, improved wear characteristics and improved reliability.

Aluminum and aluminum alloys are extensively used as metal interconnect materials. While aluminum-based materials are one of the materials of choice for use as metal interconnects, there are concerns as to whether aluminum can meet the demands required as circuit density and speeds for semiconductor devices increase. Because of these concerns, other materials are under consideration for use as metal interconnect materials in integrated circuits. Copper is one of the materials are under consideration. Advantages associated with the use of copper as a metal interconnect material include a lower susceptibility to electromigration failure (as compared to aluminum) and a lower resistivity (also as compared to aluminum).

One of the problems associated with the use of copper as a metal interconnect material is that copper readily diffuses into surrounding dielectric materials, especially silicon dioxide. In order to inhibit copper diffusion into surrounding dielectric materials, barrier-type materials can be provided to surround copper interconnects. For example, a conductive barrier layer along the side walls and bottom surface of a copper interconnect may be provided. Additionally, a dielectric layer, such as silicon nitride, may be provided on the upper surface of a copper interconnect. This is because silicon nitride is substantially impervious to the diffusion of copper atoms therethrough.

However, there are problems associated with using a silicon nitride layer over a copper interconnect. One problem is that etching procedures for removing silicon nitride from a copper surface tend to corrode or oxidize the copper surface. Corroded copper interconnects lead to short circuits which in turn result in device malfunction or failure. Another problem is that some etching procedures for removing silicon nitride poorly discriminate between silicon nitride and silicon dioxide. This problem results in inadequate trench formation. Yet another problem associated with using a silicon nitride layer over a copper interconnect is that some etching procedures for removing silicon nitride from a copper surface leave relatively large amounts of debris on the copper surface which unnecessarily complicates subsequent cleaning processes.

SUMMARY OF THE INVENTION

The present invention provides methods of etching a silicon nitride layer, which is partially or entirely disposed over a copper containing layer, that do not cause oxidation and/or corrosion in an underlying copper layer. The present invention also provides methods of etching a silicon nitride layer, which is partially or entirely disposed over a copper containing layer and under a silicon dioxide layer, that has high selectivity for silicon nitride versus silicon dioxide. The present invention provides methods of effectively anisotropically etching a silicon nitride layer minimizing profile changes in overlying materials. Since the methods of etching a silicon nitride layer according to the present invention remove nitride efficiently, subsequently performed cleaning steps are more easily conducted.

In one embodiment, the present invention relates to a method of etching silicon nitride disposed over a copper containing layer by etching at least a portion of the silicon nitride using a nitride etch gas mixture comprising from about 5 sccm to about 15 sccm of $CHF_3$, about 5 sccm to about 15 sccm of nitrogen and about 80 sccm to about 120 sccm of a carrier gas.

In another embodiment, the present invention relates to a method of processing a semiconductor substrate comprising silicon nitride disposed over a copper containing layer, involving etching at least a portion of the silicon nitride using a nitride etch gas mixture comprising $CHF_3$, nitrogen and Ar.

In yet another embodiment, the present invention relates to a method of inhibiting corrosion in a copper containing layer involving providing a semiconductor substrate, providing the copper containing layer on the semiconductor substrate, providing a silicon nitride layer on the copper containing layer and etching at least a portion of the silicon nitride layer using a nitride etch gas mixture comprising from about 5 sccm to about 15 sccm of $CHF_3$, about 5 sccm to about 15 sccm of nitrogen and about 80 sccm to about 120 sccm of Ar.

DISCLOSURE OF INVENTION

Figure 1:
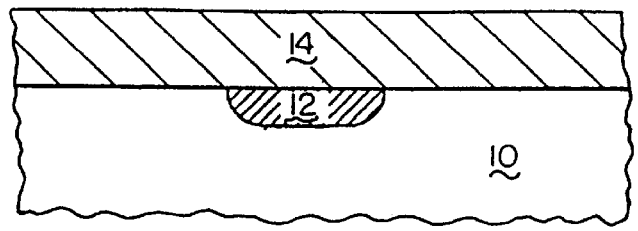
FIG. 1 illustrates a cross-sectional view of a semiconductor substrate having a diffusion region and a dielectric layer according to one aspect of the present invention.

The present invention involves etching a silicon nitride layer ($Si_3N_4$) which is disposed over a copper containing layer. A copper containing layer is a layer (or a portion of a layer) made of copper, a copper alloy or copper silicide (which is in turn over a copper or copper alloy layer). Copper alloys contain copper and one or more of aluminum, chromium, cobalt, gold, nickel, palladium, platinum, silver, tungsten and zinc. The present invention more specifically involves employing a dry etching process using a combination of gases to etch or remove silicon nitride without detrimentally affecting the underlying copper, copper alloy or copper silicide layer. In the context of the present invention, the combination of gases is termed a "nitride etch gas mixture".

In one embodiment, the nitride etch gas mixture is oxygen-free; that is, the nitride etch gas mixture does not contain oxygen gas ($O_2$, $O_3$) or a gas component containing oxygen atoms, such as $H_2O$. In another embodiment, the nitride etch gas mixture is sulfur-free; that is, the nitride etch gas mixture does not contain a gas component containing sulfur atoms, such as $SO_2$, $SF_4$ or $SF_6$.

The nitride etch gas mixture contains at least three gas components. The three gas components include $CHF_3$, nitrogen and a carrier gas. Carrier gases are non-reactive gases and generally include gases of the noble elements. Examples of carrier gases include He, Ne, Ar, Kr, Xe and combinations thereof. Various nitride etch gas mixtures include $CHF_3$, He and $N_2$; $CHF_3$, Ne and $N_2$; $CHF_3$, He, Ne and $N_2$; $CHF_3$, Ar and $N_2$; $CHF_3$, Kr and $N_2$; $CHF_3$, Xe and $N_2$; $CHF_3$, He, Ne and $N_2$; $CHF_3$, He, Ar and $N_2$; $CHF_3$, Ne, Ar and $N_2$; $CHF_3$, He, Ne, Ar and $N_2$; $CHF_3$, Ar, Kr and $N_2$; $CHF_3$, Ar, Xe and $N_2$; $CHF_3$, He, Xe and $N_2$; and $CHF_3$, Ne, Xe and $N_2$. In a preferred embodiment, the nitride etch gas mixture contains three gas components.

In one embodiment, the relative amounts of the components of the nitride etch gas mixture employed are from about 5 standard cubic centimeters per minute (sccm) to about 15 sccm of $CHF_3$, from about 80 sccm to about 120 sccm of a carrier gas and from about 5 sccm to about 15 sccm of nitrogen. In a preferred embodiment, the relative amounts of the components of the nitride etch gas mixture employed are from about 8 sccm to about 12 sccm of $CHF_3$, from about 90 sccm to about 110 sccm of a carrier gas and from about 8 sccm to about 12 sccm of nitrogen. In one embodiment, the amount of $CHF_3$ employed is different (i.e., greater than or less than) from the amount of nitrogen employed. In a preferred embodiment, the amount of $CHF_3$ employed is about the same as the amount of nitrogen employed.

The nitride etch gas mixture is contacted with a nitride layer in the form of a plasma via a reactive ion etch (RIE) apparatus or an electron cyclotron resonance (ECR) plasma reactor. RIE apparatus and ECR plasma reactors are commercially available. A parallel plate RIE apparatus is preferred. Etching a nitride layer with the nitride etch gas mixture is an anisotropic etch.

FIGS. 1–11 illustrate one embodiment of the methods of the present invention. With regard to the description in connection with the embodiment of FIGS. 1–11, the term substrate includes not only a semiconductor substrate, such as semiconductor substrate 10, but also any and all layers and structures fabricated over the semiconductor substrate up to the point of processing under discussion.

FIGS. 1–11 illustrate a method in connection with forming interconnections that make electrical contact to a diffusion legion 12 within a semiconductor substrate 10. However, the method of FIGS. 1–11 may be used to form interconnects for other purposes. For example, the method of FIGS. 1–11 may be adapted to making electrical contacts to various device structures, active elements and passive elements including polysilicon gates, wordlines, source regions, drain regions, bit lines, bases, emitters, collectors, conductive lines, conductive plugs, etc. The method of FIGS. 1–11 may be used with any suitable semiconductor technology including but not limited to NMOS, PMOS, CMOS, BiCMOS, bipolar, multi-chip modules (MCM) and III-IV semiconductors.

Referring to FIG. 1, a semiconductor substrate 10 having diffusion region 12 is provided. Semiconductor substrate 10 may include any suitable semiconductor material, for example, a monocrystalline silicon substrate. Diffusion region 12 may be any suitable doped region, for example, an $N^+$ region. A dielectric layer 14 is formed over the substrate 10. Although typically silicon dioxide, dielectric layer 14 may include any suitable dielectric material or materials, including silicon dioxide, silicon nitride, silicon oxynitride, phosphosilicate glass, borophosphosilicate glass, fluoro polymer, parylene, polyimide, any suitable spin-on glass, or any suitable spin-on polymer. Dielectric layer 14 may be formed to any suitable thickness using any suitable technique that may depend, for instance, on the material or materials used. In the case of silicon dioxide, a chemical vapor deposition (CVD) technique is useful. Also in the case of silicon dioxide, the thickness of the dielectric layer 14 may range, for example, from about 5,000 Å to about 10,000 Å.

Figure 2:
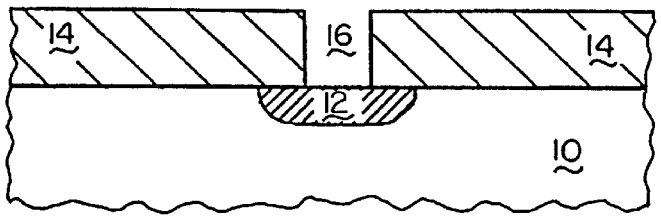
FIG. 2 illustrates a cross-sectional view of the semiconductor substrate of FIG. 1 after the dielectric layer is patterned according to one aspect of the present invention.

Referring to FIG. 2, dielectric layer 14 is patterned to define a contact opening 16 over at least a portion of a device structure, active element or passive element, or the diffusion region 12 in this instance. Any suitable patterning technique may be used to define contact opening 16 in dielectric layer 14. For example, standard photolithographic techniques may be used. In particular, a patterned photoresist layer may be formed over dielectric layer 14 and used as a mask in etching dielectric layer 14 to form contact opening 16. The photoresist layer may then be stripped from the substrate, and the substrate may be optionally cleaned to remove residue from contact opening 16.

Contact opening 16 may be formed to have any desired cross-section, width or diameter, such as about 0.35 µm, about 0.25 µm, about 0.18 µm, about 0.15 µm, about 0.1 µm and/or about 0.05 µm. The contact opening 16 preferably extends to at least a portion of a device structure, active element or passive element, or the diffusion region 12 in this instance exposing at least a portion of the diffusion region 12 in dielectric layer 14.

Figure 3:
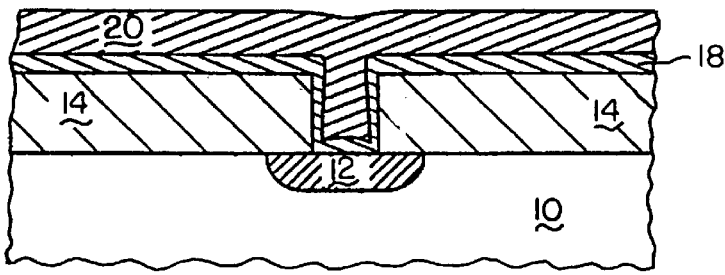
FIG. 3 illustrates a cross-sectional view of the semiconductor substrate of FIG. 2 after a conductive layer is formed according to one aspect of the present invention.

Referring to FIG. 3, the contact opening 16 is filled with an optional barrier layer 18 and a conductive layer 20. Use of the barrier layer 18 depends upon the identity of the conductive material of the conductive layer 20. The barrier layer 18 may serve as a diffusion barrier layer preventing conductive material of the conductive layer 20 from diffusing into the diffusion region 12 or into the dielectric layer 14. The barrier layer 18 is formed over the substrate so that it covers the side walls and bottom in contact opening 16. The barrier layer 18 may be made of any suitable conductive material or materials. Examples of suitable conductive materials for the barrier layer include titanium nitride, tungsten, tantalum, titanium tungsten, tantalum silicon nitride, tungsten nitride, niobium and molybdenum and combinations thereof. The barrier layer 18 may be formed using any suitable technique to a thickness sufficient to serve as a diffusion barrier for conductive layer 20. For example, the thickness of the barrier layer 18 may be in the range from about 100 Å to about 1500 Å.

Conductive layer 20 is then formed over the substrate, substantially filling contact opening 16. The conductive layer may be made of any suitable conductive material or materials. Examples of suitable conductive materials include copper, tungsten, gold, silver, aluminum, any alloys and/or combinations thereof. In this embodiment, the conductive material is copper or a copper alloy. The conductive layer 20 may be formed to any suitable thickness using any suitable technique. For example, the thickness of the conductive layer 20 may range from about 0.1 $\mu$m to about 2 $\mu$m.

In a preferred embodiment, the barrier layer 18 is made of titanium nitride and the conductive layer 20 is made of copper or a copper alloy. Titanium nitride serves as a diffusion barrier for copper, preventing copper from diffusing into the diffusion region 12 or dielectric layer 14. In embodiments where the conductive layer 20 contains copper, use of a barrier layer is preferred, especially in embodiments where the dielectric layer is silicon dioxide. The barrier layer 18 and the conductive layer 20 may be deposited using CVD techniques.

Figure 4:
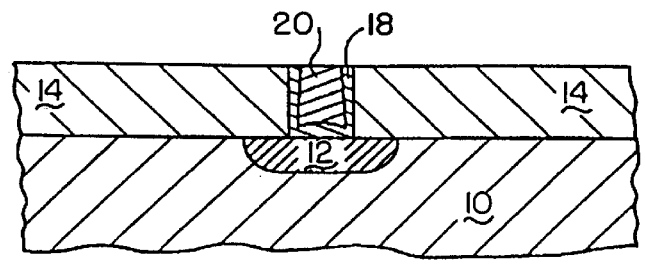
FIG. 4 illustrates a cross-sectional view of the semiconductor substrate of FIG. 3 after the conductive layer overlying the dielectric layer is removed according to one aspect of the present invention.

Referring to FIG. 4, barrier layer 18 and conductive layer 20 are planarized to the surface of the substrate; that is, until portions of the barrier layer 18 and the conductive layer 20 have been removed from the top surface of dielectric layer 14. Contact opening 16 remains filled with a contact plug including the barrier layer 18 and conductive layer 20. Any suitable technique may be used to planarize the substrate and may depend, for instance, on the material used to make the conductive layer 20 and the barrier layer 18. In one embodiment, the substrate is planarized using chemical mechanical polishing (CMP) techniques using a polishing solution or slurry depending upon the materials used for the barrier layer 18 and the conductive layer 20.

Figure 5:
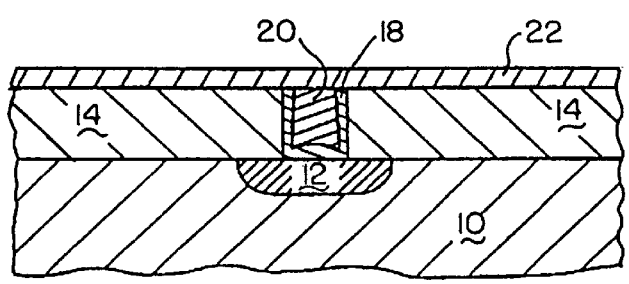
FIG. 5 illustrates a cross-sectional view of the semiconductor substrate of FIG. 4 after a silicon nitride layer is formed according to one aspect of the present invention.

Referring to FIG. 5, a silicon nitride layer 22 is formed over the substrate. In some embodiments, the silicon nitride layer 22 functions as an etch-stop layer. An etch-stop layer serves an etch resistant layer for a subsequent etch step. The silicon nitride layer 22 may be formed to any suitable thickness using any suitable technique. For example, the silicon nitride layer 22 may be formed using CVD techniques, such as low pressure chemical vapor deposition (LPCVD) or plasma enhanced chemical vapor deposition (PECVD), at a temperature from about 300° C. to about 400° C. In one embodiment, the silicon nitride layer 22 is formed to a thickness from about 200 Å to about 2000 Å. Since silicon nitride has a relatively high dielectric constant compared to silicon dioxide, the thickness of the silicon nitride layer 22 should not be so great as to significantly decrease device performance (resulting from any increased capacitance).

Figure 6:
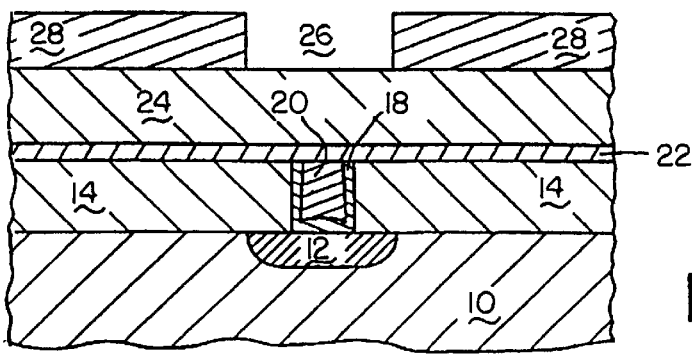
FIG. 6 illustrates a cross-sectional view of the semiconductor substrate of FIG. 5 after a dielectric layer, a patterned mask layer and an interconnect channel are formed according to one aspect of the present invention.
Figure 7:
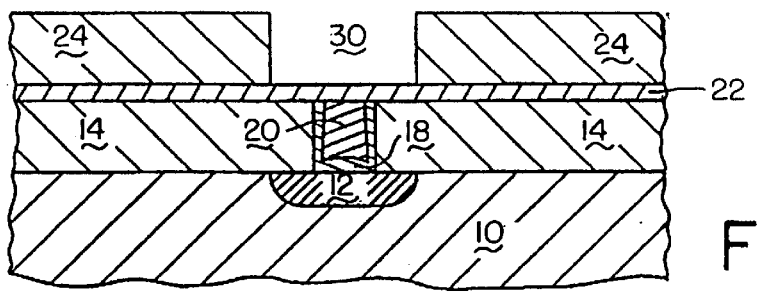
FIG. 7 illustrates a cross-sectional view of the semiconductor substrate of FIG. 6 after the dielectric layer is patterned according to one aspect of the present invention.

Referring to FIGS. 6 and 7, a patterned dielectric layer is formed over the substrate to define another opening. Specifically referring to FIG. 6, a dielectric layer 24 is initially formed over the silicon nitride layer 22. Dielectric layer 24 may include any suitable dielectric material or materials. Suitable dielectric materials include silicon dioxide, silicon oxynitride, phosphosilicate glass, borophosphosilicate glass, fluoro polymer, parylene, polyimide, any suitable spin-on glass, or any suitable spin-on polymer. Dielectric layer 24 may be formed to any suitable thickness using any suitable technique that may depend, for instance, on the material or materials used. For example, CVD techniques may be used to deposit a dielectric layer having a thickness from about 2,000 Å to about 10,000 Å. In a preferred embodiment, dielectric layer 24 is made of silicon dioxide.

Dielectric layer 24 is patterned to define an interconnect channel over at least a portion of the contact plug formed over diffusion region 12. Any suitable patterning technique may be used to define this interconnect channel in dielectric layer 24. For example, a patterned mask layer 28 may be formed over dielectric layer 24. Patterned mask layer 28 may include any suitable mask material such as a photoresist. Patterned mask layer 28 defines an opening 26 over the contact plug in dielectric layer 14.

Patterned mask layer 28 is used as a mask in etching dielectric layer 24 to form interconnect channel 26 as illustrated in FIG. 7. Any suitable etch technique may be used to etch dielectric layer 24. Preferably, a selective etch technique may be used to etch the material of dielectric layer 24 at a relatively greater rate as compared to the rate that the material of the mask layer 28 and the silicon nitride layer 22 is etched. In other words, the silicon nitride layer 22 serves as an etch-stop layer when etching dielectric layer 24.

In an embodiment where a photoresist is used for mask layer 28 and silicon dioxide is used for dielectric layer 24, a selective oxide:nitride etch technique may be used to etch dielectric layer 24 to define interconnect channel 26. This etch technique has selectivity to etch silicon dioxide from dielectric layer 24 without significantly etching silicon nitride. Mask layer 28 is then removed from the substrate. The substrate may be optionally cleaned to remove residue from interconnect channel 26.

The silicon nitride layer 22 may also serve to protect the underlying dielectric layer 14 while interconnect channel 30 is formed from dielectric layer 24. In order to form reliable interconnects using interconnect channels in the dielectric layer 24, such as interconnect channel 30, for example, the etch technique preferably removes substantially all of the dielectric material from these interconnect channels in all areas of the substrate. As dielectric layer 24 may vary in thickness across the entire substrate and as the etch rate may also vary across the substrate, interconnect channel 30 as well as other interconnect channels from dielectric layer 24 may be subjected to the etch technique longer than necessary. That is, dielectric layer 24 may be subjected to an over etch in some regions in order to help ensure that each and every interconnect channel in all areas of the substrate has been fully etched from dielectric layer 24.

In embodiments where the conductive layer 20 in dielectric layer 14 contains copper or a copper alloy, and the patterned mask layer is a photoresist, the silicon nitride layer 22 prevents the copper in the contact plug from becoming exposed to the photoresist strip technique used to remove mask layer 28. It is desirable not to expose copper to any solvent or polymer removal chemistry, since copper may corrode and oxidize and thus become less reliable as an electrical conductor. The silicon nitride layer 22 also serves as a diffusion barrier to prevent copper of the conductive layer 20 from diffusing into dielectric layer 24. Such a diffusion barrier is especially desirable when the dielectric layer 24 is made of silicon dioxide.

Interconnect channel 30 may be formed to have any desired cross-section, width or diameter, such as about 0.35 μm, about 0.25 μm, about 0.18 μm, about 0.15 μm, about 0.1 μm and/or about 0.05 μm. The width of interconnect channel 30 may depend on the resistivity of the conductive material used for creating an interconnect with interconnect channel 30. Interconnect channel 30 may be relatively narrower where conductive material having a relatively lower resistivity is used to create an interconnect with interconnect channel 30. Interconnect channel 30 extends to the silicon nitride layer 22 exposing a portion of the silicon nitride layer 22 in dielectric layer 24.

Figure 8:
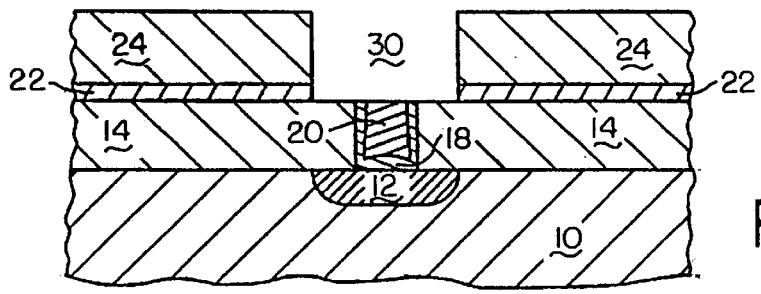
FIG. 8 illustrates a cross-sectional view of the semiconductor substrate of FIG. 7 after the silicon nitride layer is patterned according to one aspect of the present invention.

Referring to FIG. 8, the silicon nitride layer exposed in the interconnect channel 30 is removed using a nitride etch gas mixture. The etching is performed using a three component gas combination of 10 sccm $CHF_3$, 100 sccm Ar, and 10 sccm $N_2$. After the silicon nitride layer exposed in the interconnect channel 30 is removed, the substrate may be cleaned using conventional techniques such as wet cleaning techniques. Removal of the exposed portion of the silicon nitride layer 22 serves to pattern silicon nitride layer 22 creating an opening in silicon nitride layer 22 that is approximately equal in width to interconnect channel 30. During etching of the silicon nitride layer 22, copper of the conductive layer 20 is not subject to any oxidation or corrosion. The nitride etch gas mixture has high etch selectivity for silicon nitride as compared to silicon dioxide, which may constitute the dielectric layer 24. That is, the nitride etch gas mixture provides a selective etch such that dielectric layer 24 serves as a mask in etching the silicon nitride layer 22. The nitride etch gas mixture etches in an anisotropic manner whereby there is no or very little change in side wall profile of the dielectric layer 24. In a preferred embodiment, an anisotropic RIE using a three component gas combination of $CHF_3$, Ar, and $N_2$ is employed.

When the underlying dielectric layer 14 is exposed to the nitride etch gas mixture in interconnect channel 30, the underlying dielectric layer 14 is preferably made of silicon dioxide so that it may serve as an etch-stop during etching of the silicon nitride layer 22.

Figure 9:
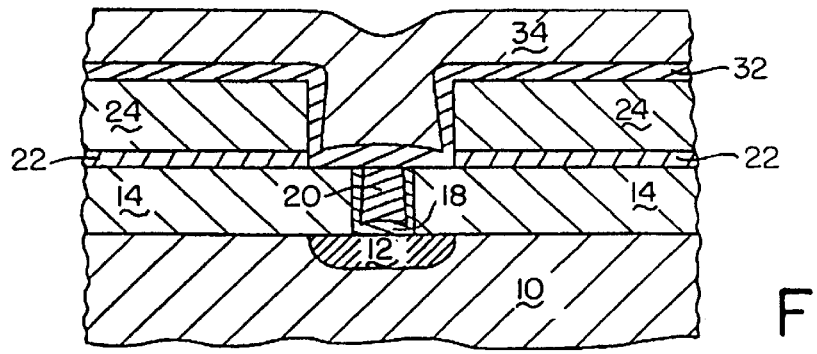
FIG. 9 illustrates a cross-sectional view of the semiconductor substrate of FIG. 8 after a conductive layer is formed according to one aspect of the present invention.

Referring to FIG. 9, the substrate including interconnect channel 30 is filled with a suitable conductive material or materials. For example, the substrate and interconnect channel 30 is filled with an optional barrier layer 32 and a conductive layer 34. The optional barrier layer 32 may serve as a diffusion barrier preventing materials from the conductive layer 34 from diffusing into dielectric layer 24 and/or dielectric layer 14. The barrier layer 32 is formed over the substrate so that it covers the side walls and bottom in interconnect channel 30. The barrier layer 32 may be made of any suitable conductive material or materials. Examples of suitable conductive materials for the barrier layer include titanium nitride, tungsten, tantalum, titanium tungsten, tantalum silicon nitride, tungsten nitride, niobium and molybdenum and combinations thereof. The barrier layer 32 may be formed using any suitable technique to a thickness sufficient to serve as a diffusion barrier for conductive layer 34. For example, the thickness of the barrier layer 32 may be in the range from about 100 Å to about 1500 Å.

Conductive layer 34 is then formed over the substrate, substantially filling interconnect channel 30. The conductive layer may be made of any suitable conductive material or materials. Examples of suitable conductive materials include copper, tungsten, gold, silver, aluminum, any alloys and/or combinations thereof. In this embodiment, the conductive material is copper or a copper alloy. The conductive layer 34 may be formed to any suitable thickness using any suitable technique. For example, the thickness of the conductive layer 34 may range from about 0.1 μm to about 2 μm.

In a preferred embodiment, the barrier layer 32 is made of titanium nitride and the conductive layer is made of copper or a copper alloy. Titanium nitride serves as a diffusion barrier for copper, preventing copper from diffusing into dielectric layers 14 and 24. In embodiments where the conductive layer 34 contains copper, use of a barrier layer is preferred, especially in embodiments where the dielectric layer is silicon dioxide. The barrier layer 32 and the conductive layer 34 may be deposited using CVD techniques.

Figure 10:
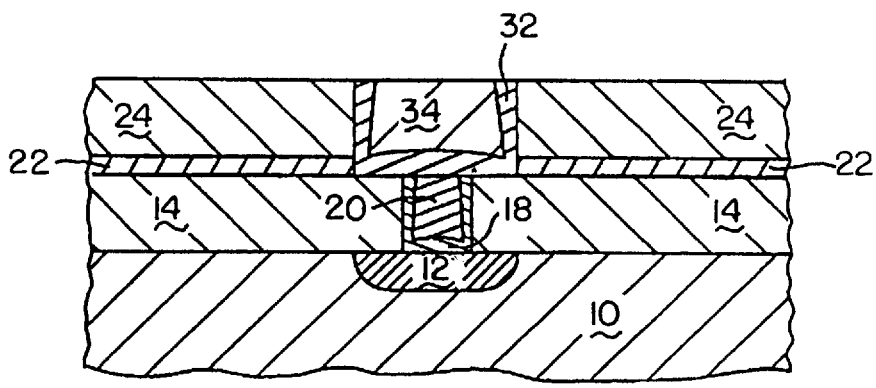
FIG. 10 illustrates a cross-sectional view of the semiconductor substrate of FIG. 9 after the conductive layer overlying the dielectric layer is removed according to one aspect of the present invention.

Referring to FIG. 10, barrier layer 32 and conductive layer 34 are planarized to the surface of the substrate; that is, until portions of the barrier layer 18 and the conductive layer 20 have been removed from the top surface of dielectric layer 24. Interconnect channel 30 remains filled with a contact plug including the barrier layer 32 and conductive layer 34. Any suitable technique may be used to planarize the substrate and may depend, for instance, on the material used to make the conductive layer 34 and the barrier layer 32. In one embodiment, the substrate is planarized using CMP techniques using a polishing solution or slurry depending upon the materials used for the barrier layer 32 and the conductive layer 34.

Figure 11:
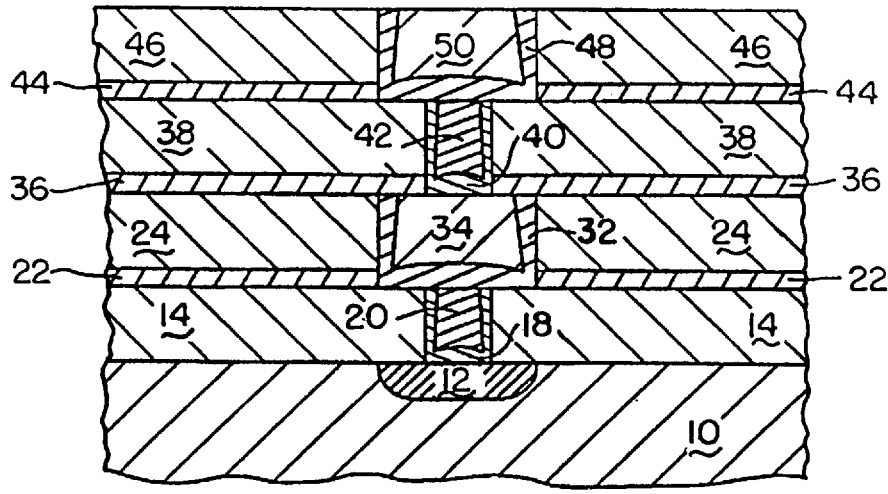
FIG. 11 illustrates a cross-sectional view of the semiconductor substrate of FIG. 10 after a via layer and another interconnect layer are formed according to one aspect of the present invention.

Referring to FIG. 11, a silicon nitride layer 36 is formed over the substrate. In some embodiments, the silicon nitride layer 36 functions as an etch-stop layer. The silicon nitride layer 36 may be formed to any suitable thickness using any suitable technique. For example, the silicon nitride layer 36 may be formed using CVD techniques, such as LPCVD or PECVD, at a temperature from about 300° C. to about 400° C. In one embodiment, the silicon nitride layer 36 is formed to a thickness from about 200 Å to about 2000 Å. Since silicon nitride has a relatively high dielectric constant compared to silicon dioxide, the thickness of the silicon nitride layer 36 should not be so great as to significantly decrease device performance (resulting from any increased capacitance).

A patterned dielectric layer is formed over the substrate to define another opening. For brevity, steps analogous or similar to those already described are not discussed with the same detail with relation to the figures. A dielectric layer 38 is initially formed over the silicon nitride layer 36. Dielectric layer 38 may include any suitable dielectric material or materials. Suitable dielectric materials include silicon dioxide, silicon oxynitride, phosphosilicate glass, borophosphosilicate glass, fluoro polymer, parylene, polyimide, any suitable spin-on glass, or any suitable spin-on polymer. Dielectric layer 38 may be formed to any suitable thickness using any suitable technique that may depend, for instance, on the material or materials used. For example, CVD techniques may be used to deposit a dielectric layer having a thickness from about 2,000 Å to about 10,000 Å. In a preferred embodiment, dielectric layer 38 is made of silicon dioxide.

Dielectric layer 38 is patterned to define a contact opening over at least a portion of the interconnect channel containing the barrier layer 32 and the conductive layer 34. The contact opening may be formed to have any desired cross-section, width or diameter, such as about 0.35 μm, about 0.25 μm, about 0.18 μm, about 0.15 μm, about 0.1 μm and/or about 0.05 μm. The contact opening preferably extends to at least a portion of the interconnect channel containing the barrier layer 32 and the conductive layer 34 exposing at least a portion of the conductive layer 34 in dielectric layer 24.

Any suitable patterning technique may be used to define contact opening in dielectric layer 38. For example, standard photolithographic techniques may be used. In particular, a patterned photoresist layer may be formed over dielectric layer 38 and used as a mask in etching dielectric layer 38 to form the contact opening. The photoresist layer may then be stripped from the substrate, and the substrate may be optionally cleaned to remove residue from the contact opening. Preferably, a selective etch technique may be used to etch the material of dielectric layer 38 at a relatively greater rate as compared to the rate that the material of the mask layer and the silicon nitride layer 36 is etched. In other words, the silicon nitride layer 36 serves as an etch-stop layer when etching dielectric layer 38.

In an embodiment where a photoresist is used for mask layer and silicon dioxide is used for dielectric layer 38, a selective oxide:nitride etch technique may be used to etch dielectric layer 38 to partially defame the contact opening. This etch technique has selectivity to etch silicon dioxide from dielectric layer 38 without significantly etching silicon nitride. The substrate may then be optionally cleaned to remove any residue.

The silicon nitride layer 36 may also serve to protect the underlying dielectric layer 24 while the contact opening is partially formed from dielectric layer 38. In order to form reliable contacts using contact openings in the dielectric layer 38, the etch technique preferably removes substantially all of the dielectric material from these contact openings in all areas of the substrate. As dielectric layer 38 may vary in thickness across the entire substrate and as the etch rate may also vary across the substrate, some of the contact openings from dielectric layer 38 may be subjected to the etch technique longer than necessary. That is, dielectric layer 38 may be subjected to an over etch in some regions in order to help ensure that each and every contact opening in all areas of the substrate has been fully etched from dielectric layer 38.

In embodiments where the conductive layer 34 in dielectric layer 24 contains copper or a copper alloy, the silicon nitride layer 36 prevents the copper in the contact plug from becoming exposed to the photoresist strip technique used to remove the mask layer used to pattern the dielectric layer 38. It is desirable not to expose copper to any solvent or polymer removal chemistry, since copper may corrode and oxidize and thus become less reliable as an electrical conductor. The silicon nitride layer 36 also serves as a diffusion barrier to prevent copper of the conductive layer 34 from diffusing into dielectric layer 38. Such a diffusion barrier is especially desirable when the dielectric layer 38 is made of silicon dioxide.

The silicon nitride layer 36 exposed in the contact opening is removed using a nitride etch gas mixture. The etching is performed using a three component gas combination of 10 sccm $CHF_3$, 100 sccm Ar, and 10 sccm $N_2$. After the silicon nitride layer exposed in the contact opening is removed, the substrate may be cleaned using conventional techniques such as wet cleaning techniques. Removal of the exposed portion of the silicon nitride layer 36 serves to pattern silicon nitride layer 36 creating an opening in silicon nitride layer 36 that is approximately equal in width to the opening in the dielectric layer 38. During etching of the silicon nitride layer 36, copper of the conductive layer 34 is not subject to any oxidation or corrosion. The nitride etch gas mixture has high etch selectivity for silicon nitride as compared to silicon dioxide, which may constitute the dielectric layer 38. That is, the nitride etch gas mixture provides a selective etch such that dielectric layer 38 serves as a mask in etching the silicon nitride layer 36. The nitride etch gas mixture etches in an anisotropic manner whereby there is no or very little change in side wall profile of the dielectric layer 38. In a preferred embodiment, an anisotropic RIE using a three component gas combination of $CHF_3$, Ar, and $N_2$ is employed.

The contact opening is filled with an optional barrier layer 40 and a conductive layer 42. Use of the barrier layer 40 depends upon the identity of the conductive material of the conductive layer 42. The barrier layer 40 may serve as a diffusion barrier layer preventing conductive material of the conductive layer 42 from diffusing into the dielectric layer 38. The barrier layer 40 is formed over the substrate so that it covers the side walls and bottom in the contact opening. The barrier layer 40 may be made of any suitable conductive material or materials. Examples of suitable conductive materials for the barrier layer include titanium nitride, tungsten, tantalum, titanium tungsten, tantalum silicon nitride, tungsten nitride, niobium and molybdenum and combinations thereof. The barrier layer 40 may be formed using any suitable technique to a thickness sufficient to serve as a diffusion barrier for conductive layer 42. For example, the thickness of the barrier layer 40 may be in the range from about 100 Å to about 1500 Å.

Conductive layer 42 is then formed over the substrate, substantially filling the contact opening. The conductive layer may be made of any suitable conductive material or materials. Examples of suitable conductive materials include copper, tungsten, gold, silver, aluminum, any alloys and/or combinations thereof. In this embodiment, the conductive material is copper or a copper alloy. The conductive layer 42 may be formed to any suitable thickness using any suitable technique. For example, the thickness of the conductive layer 42 may range from about 0.1 µm to about 2 µm.

In a preferred embodiment, the barrier layer 40 is made of titanium nitride and the conductive layer is made of copper or a copper alloy. Titanium nitride serves as a diffusion barrier for copper, preventing copper from diffusing into the dielectric layer 38. In embodiments where the conductive layer 42 contains copper, use of a barrier layer is preferred, especially in embodiments where the dielectric layer 38 is silicon dioxide. The barrier layer 40 and the conductive layer 42 may be deposited using CVD techniques.

The barrier layer 40 and conductive layer 42 are planarized to the surface of the substrate; that is, until portions of the barrier layer 40 and the conductive layer 42 have been removed from the top surface of dielectric layer 38 the contact opening remains filled with a contact plug including the barrier layer 40 and conductive layer 42. Any suitable technique may be used to planarize the substrate and may depend, for instance, on the material used to make the conductive layer 42 and the barrier layer 40. In one embodiment, the substrate is planarized using CMP techniques using a polishing solution or slurry depending upon the materials used for the, barrier layer 40 and the conductive layer 42.

A silicon nitride layer 44 is then formed over the substrate. In some embodiments, the silicon nitride layer 44 functions as an etch-stop layer. The silicon nitride layer 44 may be formed to any suitable thickness using any suitable technique. For example, the silicon nitride layer 44 may be formed using CVD techniques, such as LPCVD or PECVD, at a temperature from about 300° C. to about 400° C. In one embodiment, the silicon nitride layer 44 is formed to a thickness from about 200 Å to about 2000 Å. Since silicon nitride has a relatively high dielectric constant compared to silicon dioxide, the thickness of the silicon nitride layer 44 should not be so great as to significantly decrease device performance (resulting from any increased capacitance).

A patterned dielectric layer is formed over the substrate to define another opening. Referring again to FIG. 11, a dielectric layer 46 is initially formed over the silicon nitride layer 44. Dielectric layer 46 may include any suitable dielectric material or materials. Suitable dielectric materials include silicon dioxide, silicon oxynitride, phosphosilicate glass, borophosphosilicate glass, fluoro polymer, parylene, polyimide, any suitable spin-on glass, or any suitable spin-on polymer. Dielectric layer 46 may be formed to any suitable thickness using any suitable technique that may depend, for instance, on the material or materials used. For example, CVD techniques may be used to deposit a dielectric layer having a thickness from about 2,000 Å to about 10,000 Å. In a preferred embodiment, dielectric layer 46 is made of silicon dioxide.

Dielectric layer 46 is patterned to define an interconnect channel over at least a portion of the contact plug formed in dielectric layer 38. Any suitable patterning technique may be used to define this interconnect channel in dielectric layer 46. For example, a patterned mask layer may be formed over dielectric layer 46. The patterned mask layer may include any suitable mask material such as a photoresist. Patterned mask layer defines an opening over the contact plug in dielectric layer 38.

The patterned mask layer is used as a mask in etching dielectric layer 46 to form an interconnect channel. Any suitable etch technique may be used to etch dielectric layer 46. Preferably, a selective etch technique may be used to etch the material of dielectric layer 46 at a relatively greater rate as compared to the rate that the material of the mask layer and the silicon nitride layer 44 is etched. In other words, the silicon nitride layer 44 serves as an etchstop layer when etching dielectric layer 46.

In an embodiment where a photoresist is used for the mask layer and silicon dioxide is used for dielectric layer 46, a selective oxide:nitride etch technique may be used to etch dielectric layer 46 to define the interconnect channel. This etch technique has selectivity to etch silicon dioxide from dielectric layer 46 without significantly etching silicon nitride. The mask layer is then removed from the substrate. The substrate may be optionally cleaned to remove residue from the interconnect channel.

The silicon nitride layer 44 may also serve to protect the underlying dielectric layer 38 while the interconnect channel is formed from dielectric layer 46. In order to form reliable interconnects using interconnect channels in the dielectric layer 46, the etch technique preferably removes substantially all of the dielectric material from these interconnect channels in all areas of the substrate. As dielectric layer 46 may vary in thickness across the entire substrate and as the etch rate may also vary across the substrate, some of the interconnect channels from dielectric layer 46 may be subjected to the etch technique longer than necessary. That is, dielectric layer 46 may be subjected to an over etch in some regions in order to help ensure that each and every interconnect channel in all areas of the substrate has been fully etched from dielectric layer 46.

In embodiments where the conductive layer 42 in dielectric layer 38 contains copper or a copper alloy, and the patterned mask layer is a photoresist, the silicon nitride layer 44 prevents the copper in the contact plug from becoming exposed to the photoresist strip technique used to remove the mask layer. It is desirable not to expose copper to any solvent or polymer removal chemistry, since copper may corrode and oxidize and thus become less reliable as an electrical conductor. The silicon nitride layer 44 also serves as a diffusion barrier to prevent copper of the conductive layer 42 from diffusing into dielectric layer 46. Such a diffusion barrier is especially desirable when the dielectric layer 46 is made of silicon dioxide.

The interconnect channel may be formed to have any desired cross-section, width or diameter, such as about 0.35 $\mu$m, about 0.25 $\mu$m, about 0.18 $\mu$m, about 0.15 $\mu$m, about 0.1 $\mu$m and/or about 0.05 $\mu$m. The width of the interconnect channel may depend on the resistivity of the conductive material used for creating an interconnect with the interconnect channel. The interconnect channel may be relatively narrower where conductive material having a relatively lower resistivity is used to create an interconnect with the interconnect channel. The interconnect channel extends to the silicon nitride layer 44 exposing a portion of the silicon nitride layer 44 in dielectric layer 46.

The silicon nitride layer 44 exposed in the interconnect channel is removed using a nitride etch gas mixture. The etching is performed using a three component gas combination of 10 sccm $CHF_3$, 100 sccm Ar, and 10 sccm $N_2$. After the silicon nitride layer exposed in the interconnect channel is removed, the substrate may be cleaned using conventional techniques such as wet cleaning techniques. Removal of the exposed portion of the silicon nitride layer 44 serves to pattern silicon nitride layer 44 creating an opening in silicon nitride layer 44 that is approximately equal in width to the opening in the dielectric layer 46. During etching of the silicon nitride layer 44, copper of the conductive layer 42 is not subject to any oxidation or corrosion. The nitride etch gas mixture has high etch selectivity for silicon nitride as compared to silicon dioxide, which may constitute the dielectric layer 46. That is, the nitride etch gas mixture provides a selective etch such that dielectric layer 46 serves as a mask in etching the silicon nitride layer 44. The nitride etch gas mixture etches in an anisotropic manner whereby there is no or very little change in side wall profile of the dielectric layer 46. In a preferred embodiment, an anisotropic RIE using a three component gas combination of $CHF_3$, Ar, and $N_2$ is employed.

When the underlying dielectric layer 38 is exposed to the nitride etch gas mixture in the interconnect channel, the underlying dielectric layer 38 is preferably made of silicon dioxide so that it may serve as an etch-stop during etching of the silicon nitride layer 44.

Subsequently, the substrate including the interconnect channel is filled with a suitable conductive material or materials. For example, the substrate and interconnect channel are filled with an optional barrier layer 48 and a conductive layer 50. The optional barrier layer 48 may serve as a diffusion barrier preventing materials from the conductive layer 50 from diffusing into dielectric layer 46 and/or dielectric layer 38. The barrier layer 48 is formed over the substrate so that it covers the side walls and bottom in the interconnect channel. The barrier layer 48 may be made of any suitable conductive material or materials. Examples of suitable conductive materials for the barrier layer include titanium nitride, tungsten, tantalum, titanium tungsten, tantalum silicon nitride, tungsten nitride, niobium and molybdenum and combinations thereof. The barrier layer 48 may be formed using any suitable technique to a thickness sufficient to serve as a diffusion barrier for conductive layer 50. For example, the thickness of the barrier layer 48 may be in the range from about 100 Å to about 1500Å.

Conductive layer 50 is then formed over the substrate, substantially filling the interconnect channel. The conductive layer may be made of any suitable conductive material or materials. Examples of suitable conductive materials include copper, tungsten, gold, silver, aluminum, any alloys and/or combinations thereof. In this embodiment, the conductive material is copper or a copper alloy. The conductive layer 50 may be formed to any suitable thickness using any suitable technique. For example, the thickness of the conductive layer 50 may range from about 0.1 $\mu$m to about 2 $\mu$m.

In a preferred embodiment, the barrier layer 48 is made of titanium nitride and the conductive layer 50 is made of copper or a copper alloy. Titanium nitride serves as a diffusion barrier for copper, preventing copper from diffusing into dielectric layers 46 and 38. In embodiments where the conductive layer 50 contains copper, use of a barrier layer is preferred, especially in embodiments where the dielectric layer is silicon dioxide. The barrier layer 48 and the conductive layer 50 may be deposited using CVD techniques.

The barrier layer 48 and conductive layer 50 are planarized to the surface of the substrate; that is, until portions of the barrier layer 48 and the conductive layer 50 have been removed from the top surface of dielectric layer 46. The interconnect channel remains filled with a contact plug including the barrier layer 48 and conductive layer 50. Any suitable technique may be used to planarize the substrate and may depend, for instance, on the material used to make the conductive layer 50 and the barrier layer 48. In one embodiment, the substrate is planarized using CMP techniques using a polishing solution or slurry depending upon the materials used for the barrier layer 48 and the conductive layer 50.

Although embodiments where the conductive layers 20, 34, 42 and 50 contain copper or a copper alloy have been described in FIGS. 1–11, it will be appreciated that some of these layers may contain different conductive materials, so long as at least one of the conductive layers (with at some point a silicon layer formed thereover) is a copper containing layer. For example, in another embodiment of the invention, the procedures represented by FIGS. 1–11 are performed except that conductive layers 34 and 50 contain copper while conductive layers 20 and 42 contain tungsten or aluminum.

Generally referring to FIGS. 1–11, the methods disclosed herein may be used to create another via layer and another interconnect layer. In fact, it will be appreciated that the method can be used repeatedly to create multilayered structures with numerous via layers and/or interconnect layers.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of etching silicon nitride disposed over a copper containing layer, comprising:
    etching at least a portion of the silicon nitride using a nitride etch gas mixture comprising from about 5 sccm to about 15 sccm of $CHF_3$, about 5 sccm to about 15 sccm of nitrogen and about 80 sccm to about 120 sccm of a carrier gas,
    wherein the nitride etch as mixture is oxygen-free.

2. The method of claim 1, wherein the nitride etch gas mixture is sulfur-free.

3. The method of claim 1, wherein the etching is performed in a reactive ion etch apparatus.

4. The method of claim 1, wherein the etching is performed in an electron cyclotron resonance plasma reactor.

5. The method of claim 1, wherein the carrier gas comprises at least one of He, Ne, Ar, Kr and Xe.

6. The method of claim 1, wherein the carrier gas comprises Ar.

7. A method of processing a semiconductor substrate comprising silicon nitride disposed over a copper containing layer, comprising:
    etching at least a portion of the silicon nitride using a nitride etch gas mixture comprising $CHF_3$, nitrogen and Ar,
    wherein the nitride etch gas mixture is oxygen-free.

8. The method of claim 7, wherein the nitride etch gas mixture is sulfur-free.

9. The method of claim 7, wherein the nitride etch gas mixture comprises substantially the same amount of $CHF_3$ as nitrogen.

10. The method of claim 7, wherein the etching is performed in a reactive ion etch apparatus.

11. The method of claim 7, wherein the etching is performed in an electron cyclotron resonance plasma reactor.

12. The method of claim 7, wherein the copper containing layer is a copper interconnect structure.

13. The method of claim 7, wherein the nitride etch gas mixture comprises from about 8 sccm to about 12 sccm of $CHF_3$, about 8 sccm to about 12 sccm of nitrogen and about 90 sccm to about 110 sccm of Ar.

14. A method of inhibiting corrosion in a copper containing layer, comprising:
    providing a semiconductor substrate;
    providing the copper containing layer on the semiconductor substrate;
    providing a silicon nitride layer on the copper containing layer; and
    etching at least a portion of the silicon nitride layer using a nitride etch gas mixture comprising from about 5 sccm to about 15 sccm of $CHF_3$, about 5 sccm to about 15 sccm of nitrogen and about 80 sccm to about 120 sccm of Ar,
    wherein the nitride etch gas mixture is oxygen-free.

15. The method of claim 14, wherein the copper containing layer is a copper interconnect structure.

16. The method of claim 14, wherein the nitride etch gas mixture comprises from about 8 sccm to about 12 sccm of $CHF_3$, about 8 sccm to about 12 sccm of nitrogen and about 90 sccm to about 110 sccm of Ar.

17. The method of claim 14, wherein the nitride etch gas mixture is sulfur-free.

18. The method of claim 14, wherein the etching is performed in one of a reactive ion etch apparatus and an electron cyclotron resonance plasma reactor.

19. The method of claim 14, wherein the silicon nitride layer is provided on the copper containing layer by plasma enhanced chemical vapor deposition at a temperature from about 300° C. to about 400° C.

20. The method of claim 1, wherein the nitride etch gas mixture does not contain an oxygen gas component or a gas component which contains oxygen atoms.

21. The method of claim 7, wherein the nitride etch gas mixture does not contain an oxygen gas component or a gas component which contains oxygen atoms.

22. The method of claim 14, wherein the nitride etch gas mixture does not contain an oxygen gas component or a gas component which contains oxygen atoms.

* * * * *

UNITED STATES PATENT AND TRADEMARK OFFICE
CERTIFICATE OF CORRECTION

PATENT NO : 6,107,208
DATED : August 22, 2000
INVENTOR(S) : Jerry Cheng and Fei Wang It is certified that error appears in the above-identified patent and that said Letters Patent are hereby corrected as shown below:

Col. 4, line 10
replace "legion"
with --region--.

Col. 9, line 11
replace "defame"
with --define--.

Col. 13, line 54
replace "etch as mixture"
with --etch gas mixture--.

Signed and Sealed this

Twenty-fourth Day of April, 2001

*Attest:*

NICHOLAS P. GODICI

*Attesting Officer*   *Acting Director of the United States Patent and Trademark Office*